(12) United States Patent
Kasa

(10) Patent No.: US 7,679,150 B2
(45) Date of Patent: Mar. 16, 2010

(54) SEMICONDUCTOR DEVICE AND PROGRAMMING METHOD THEREFOR

(75) Inventor: Yasushi Kasa, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 658 days.

(21) Appl. No.: 11/414,081

(22) Filed: Apr. 27, 2006

(65) Prior Publication Data

US 2007/0052064 A1    Mar. 8, 2007

Related U.S. Application Data

(63) Continuation of application No. PCT/JP2005/008058, filed on Apr. 27, 2005.

(51) Int. Cl.
*H01L 29/72* (2006.01)

(52) U.S. Cl. .................. 257/414; 257/401; 257/529; 257/532; 257/622

(58) Field of Classification Search ............. 257/401, 257/414, 529, 532, 622
See application file for complete search history.

(56) References Cited

U.S. PATENT DOCUMENTS

| | | | |
|---|---|---|---|
| 6,236,587 | B1 | 5/2001 | Gudesen et al. |
| 6,617,172 | B2 | 9/2003 | Usami |
| 7,298,242 | B2 * | 11/2007 | Fujita et al. ............. 340/5.83 |
| 2002/0074666 | A1 | 6/2002 | Usami |

FOREIGN PATENT DOCUMENTS

| | | |
|---|---|---|
| EP | 1 010 181 | 6/2000 |
| JP | 53-124919 | 10/1978 |
| JP | 2002 500430 | 1/2002 |
| JP | 2002 063796 | 2/2002 |
| JP | 2002 184872 | 6/2002 |
| JP | 2004 213872 | 7/2004 |
| JP | 2004 246958 | 9/2004 |
| WO | WO 99/14763 | 3/1999 |

\* cited by examiner

*Primary Examiner*—Edward Wojciechowicz

(57) ABSTRACT

A semiconductor device is provided which includes a pair of metal interconnections (B, C) provided above a semiconductor substrate (10), a program layer (20) provided over the pair of metal interconnections (B, C) and in which an opening (21) may be selectively formed in the program layer (20) on the basis of programming information, and a read circuit (40) reading the programming information by determining whether such an opening (21) is formed in the program layer (20) by utilizing an electrostatic capacitance between the pair of metal interconnections (B, C). The program layer (20) may be made of a material having a dielectric constant higher than that of air or the program layer (20) may be made of a conductor or a material having a dielectric constant lower than that of air. Thus, trimming information or information on a device identification (ID) can be stored, even if the semiconductor device is a logic device that does not have a memory transistor, by detecting the information that is determined by the electrostatic capacitance that varies depending on whether or not there is provided an opening (21).

6 Claims, 10 Drawing Sheets

SEMICONDUCTOR DEVICE AND PROGRAMMING METHOD THEREFOR

CROSS-REFERENCES TO RELATED APPLICATIONS

This is a continuation of International Application No. PCT/JP2005/008058, filed Apr. 27, 2005 which was not published in English under PCT Article 21 (2).

BACKGROUND OF THE INVENTION

1. Field of the Invention

This invention relates generally to semiconductor devices and data reading methods therefor, and fabricating methods of such semiconductor devices.

2. Description of the Related Art

Some conventional non-volatile memories have Contents Addressable Memory (CAM) cells that store device information such as device IDs used for various tests or device identification, or trimming data for adjusting the circuit characteristics with ease (such as disclosed in Japanese Patent Application Publication No. 2004-213872).

A CAM cell is composed of a floating gate and a control gate stacked above a semiconductor substrate to form a gate with a source and a drain respectively formed in the semiconductor substrate at both sides of the gate. That is, the CAM cell has the same configuration as that of a cell transistor that serves as a memory transistor.

In recent years, miniaturization and high integration of semiconductor devices has led to more defects, resulting in reduced yield. To address this problem, a redundant circuit is sometimes provided in the semiconductor device. There has been proposed a technique in which the information on the redundant addresses, operation specifications, and other device specific information can be stored by cutting off a fuse provided in a fuse circuit in the semiconductor device (such as disclosed in Japanese Patent Application Publication No. 2004-246958).

A logic device, however, does not typically include the aforedescribed CAM, and it is problematic that the device ID or the trimming data cannot be retained. In a case where a non-volatile memory is employed for retaining the information, there are additional problems in that more steps are necessary during wafer processing for such fuse programming circuit and the scale of the programming circuit is large relative to the memory capacity.

In a semiconductor device having the abovedescribed fuse, if the fuse, which is made of a metal, is not cut off completely, the difference in voltage applied to both ends of the fuse gradually decreases the resistance value of the fuse. This is called grow back effect. When the resistance value of the fuse is lowered to less than a given value, the fuse circuit judges that the fuse is not melted down. This causes a problem in that the fuse cannot be melted down successfully. With respect to a laser fuse, an underlying layer is necessary in consideration of the damage applied by the laser to the semiconductor substrate and, thus, a cover film needs to be opened. This is also problematic in view of reliability.

SUMMARY OF THE INVENTION

The present invention has been made to overcome the above drawbacks of the prior art and has an object of providing a semiconductor device having a memory in which trimming information, device identification (ID) information, and/or the like is stored and a fabricating method therefor.

According to an aspect of the present invention, preferably, there is provided a semiconductor device including a pair of metal interconnections provided above a semiconductor substrate, a program layer provided over the pair of metal interconnections and in which an opening may be selectively formed in the program layer on the basis of programming information, and a read circuit reading the programming information by determining whether such an opening is formed in the program layer by utilizing an electrostatic capacitance between the pair of metal interconnections. In accordance with the present invention, the information can be retained even if there is an opening in the program layer. Accordingly, the trimming information, the device ID information, and/or the like can be stored in a logic device that does not have a memory transistor. Unlike a CAM cell, a memory transistor does not have to be included and the number of steps is not increased during wafer processing. In addition, there is no need for a read circuit, advantageously preserving semiconductor die space. Further, the semiconductor device employed in the present invention has a higher reliability than that having a fuse.

The semiconductor device may additionally include a pair of reference metal interconnections formed below the program layer, wherein the read circuit determines whether such an opening is formed in the program layer by utilizing the electrostatic capacitance between the pair of metal interconnections and an electrostatic capacitance between the pair of reference metal interconnections. In the abovedescribed semiconductor device, preferably, the pair of metal interconnections and the pair of reference metal interconnections have a shared metal interconnection portion. The program layer may be made of a material having a dielectric constant higher than that of air, or the program layer may be made of either a conductor or a material having a dielectric constant lower than that of air. The semiconductor device may further include a memory cell array having non-volatile memory cells arranged in rows and columns.

According to another aspect of the present invention, preferably, there is provided a data reading method including the steps of applying a voltage across a pair of metal interconnections provided below a program layer in which an opening may be selectively formed on the basis of programming information and reading the programming information by determining whether such an opening is formed in the program layer by utilizing an electrostatic capacitance between the pair of metal interconnections. In accordance with the present invention, the information can be retained even if there is an opening in the program layer. Accordingly, the trimming information, the device ID information, or the like can be stored in a logic device that does not have a memory transistor. Unlike the CAM cell, the memory transistor does not have to be included and the number of steps is not increased during wafer processing. In addition, there is no need for a read circuit, thereby advantageously providing more space on the semiconductor die. Consequently, the semiconductor device employed in the present invention has a higher reliability than that having a fuse.

The data reading method may further include applying another voltage across a pair of reference metal interconnections provided below the program layer wherein it is determined whether such an opening is formed in the program layer by utilizing the electrostatic capacitance between the pair of metal interconnections and an electrostatic capacitance between the pair of reference metal interconnections.

According to yet another aspect of the present invention, preferably, there is provided a method of fabricating a semiconductor device including the steps of forming a pair of metal interconnections above a semiconductor substrate, forming a program layer over the pair of metal interconnections, and selectively forming an opening in the program layer on the basis of programming information. In accordance with the present invention, the information can be retained even if there is an opening in the program layer. Accordingly, the trimming information, the device ID information, and/or the like can be stored in a logic device that does not have a memory transistor. Unlike a CAM cell, a memory transistor does not have to be included and the number of steps is not increased during wafer processing. In addition, there is no need for a read circuit, thereby advantageously preserving semiconductor die space. The semiconductor device employed in the present invention, accordingly, has a higher reliability than that utilizing a fuse.

Thus, in accordance with the present invention, it is possible to provide a semiconductor device having a memory in which trimming information, device ID information, and/or the like is stored, even in a logic device that does not have a memory transistor, and a fabricating method therefor.

DESCRIPTION OF THE PREFERRED EMBODIMENTS

A description will now be given, with reference to the accompanying drawings, of embodiments of the present invention wherein One Time Programmable (OTP) memory, as described below, is employed instead of Contents Addressable Memory (CAM). OTP memory in accordance with embodiments of the present invention can also be used in a logic device.

Figure 1:
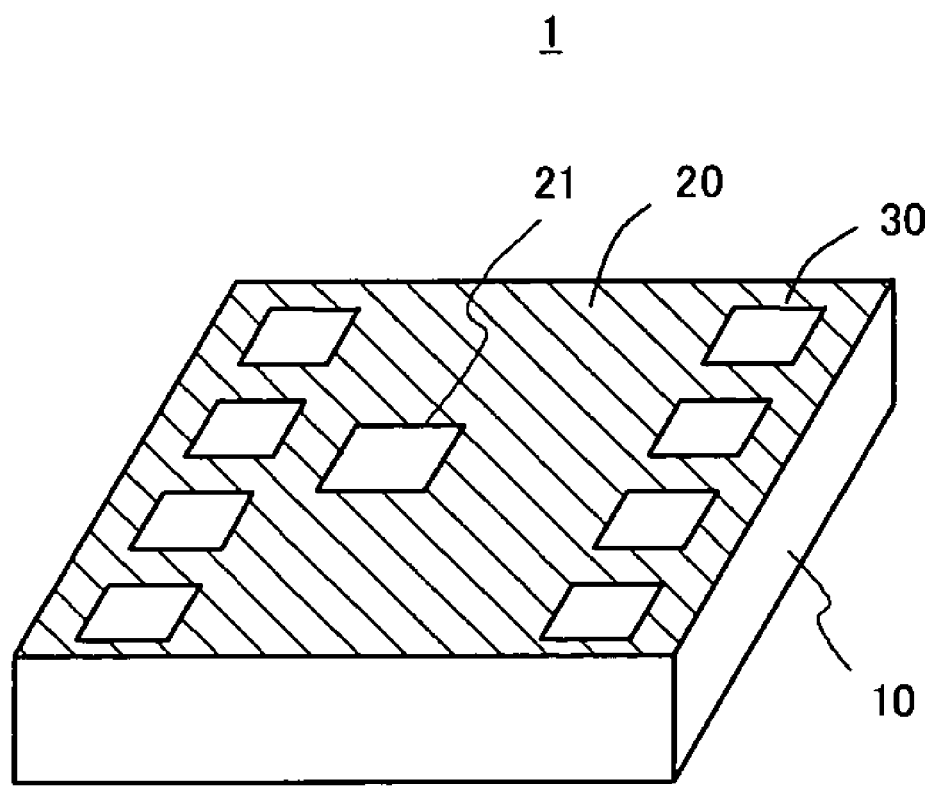
FIG. 1 is a view of a logic device subsequent to wafer processing in accordance with an embodiment of the present invention.

FIG. 1 is a view of a logic device (semiconductor die) subsequent to wafer processing thereof. The logic device 1 includes a semiconductor substrate 10 with a program layer 20 formed thereabove. An opening 21 is formed in the program layer 20 and pads 30 are formed on the program layer 20. A memory device of such a semiconductor device 1 includes a pair of metal interconnections and a dielectric film provided over the metal interconnections. The memory stores information to be determined by an electrostatic capacitance value that varies depending on whether there is an opening 21 in the program layer 20 provided above the pair of metal interconnections.

Figure 2A:
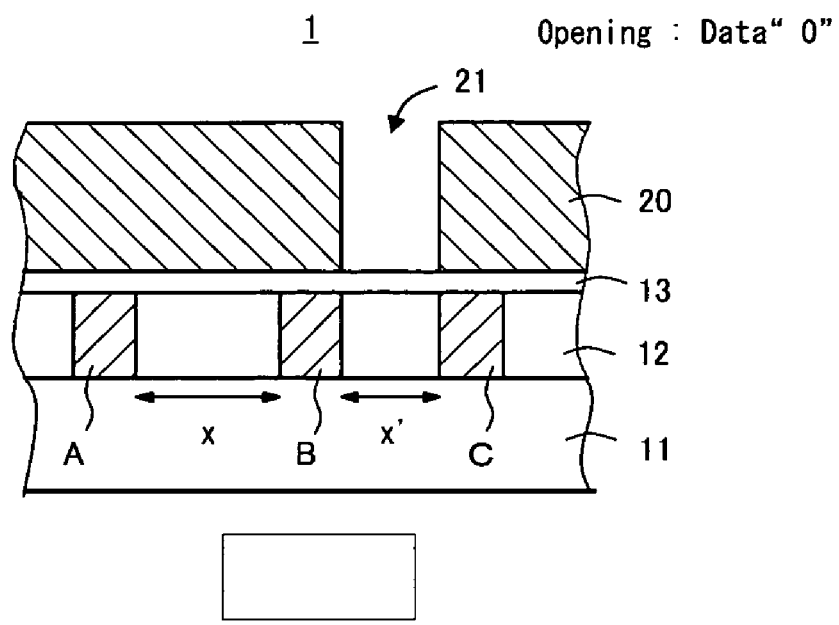
FIG. 2(a) is a cross-sectional view of the logic device in which data "0" is stored in a program layer in accordance with an embodiment of the present invention.
Figure 2B:
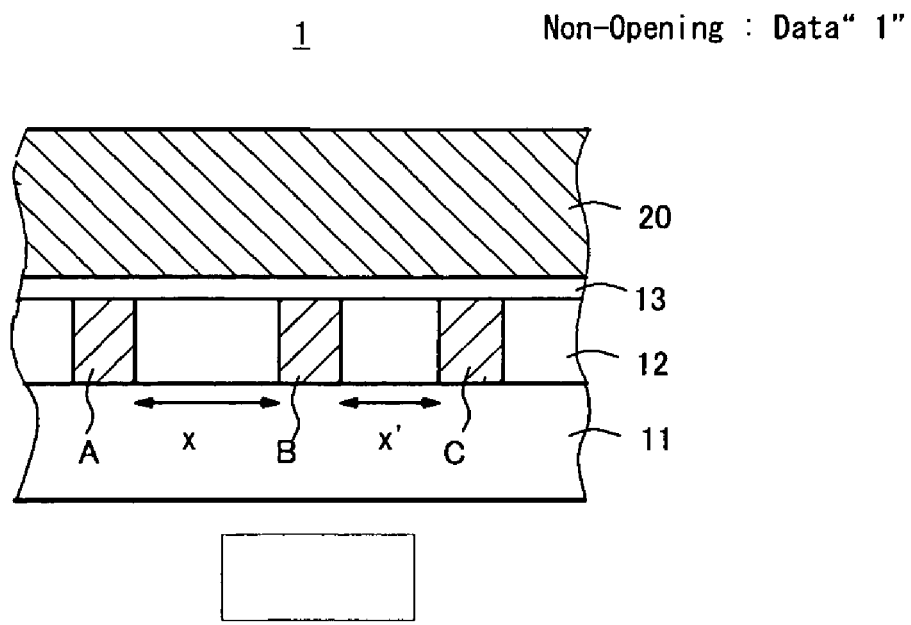
FIG. 2(b) is a cross-sectional view of the logic device in which data "1" is stored in the program layer in accordance with an embodiment of the present invention.

FIG. 2(a) is a cross-sectional view of the logic device 1 in which data "0" is stored in the program layer 20. FIG. 2(b) is a cross-sectional view of the logic device 1 in which data "1" is stored in the program layer 20. Referring to FIGS. 2(a) and 2(b), metal interconnections A, B, and C are formed on an interlayer insulating film 11 provided above the semiconductor substrate 10 (FIG. 1). The metal interconnections A and B form a pair of reference metal interconnections, and the metal interconnections B and C form a pair of metal interconnections. The metal interconnection B is commonly shared by the pair of metal interconnections and the pair of reference metal interconnections. Here, a distance x between the metal interconnections A and B is configured longer than a distance x' between the metal interconnections B and C. The metal interconnections are insulated one from another by a silicon dioxide ($SiO_2$) layer 12.

A cover film 13 is provided on the metal interconnections A, B. and C and the $SiO_2$ layer 12. The cover film 13 is preferably made of a $SiO_2$ film. The program layer 20 is provided on the cover film 13, and the opening 21 is selectively formed in the program layer 20 in accordance with programming information. The program layer 20 is preferably made of a silicon nitride (SiN) film and serves as a passivation film. In accordance with the present invention, the program layer 20 is made of a material having a dielectric constant higher than that of air. Therefore, a portion of the logic device 1 including the program layer 20 has high parasitic capacitance, and a portion a portion of the logic device 1 including the opening 21 has low parasitic capacitance.

Accordingly, the data "0" or "1" can be stored in the memory of the present invention by utilizing the difference in electrostatic capacitance that varies depending on whether or not the program layer 20 has the opening 21. Such a configuration is easily applicable to a logic device that does not have a memory transistor.

The opening 21 is formed in the program layer 20 by applying the SiN film on a whole surface and removing a portion from the program layer 20. The portion may be removed from the program layer 20 to form the opening 21 by a method of melting the portion with the use of laser beam, a method of etching away the portion with the use of a chemical solution, a method of removing the portion by mechanically scraping away the portion, or similar methods. Also, the program layer 20 may be formed by applying ink onto the cover film 13 or applying a metal with the use of a Focused Ion Beam (FIB).

When the data "0" is stored in the program layer 20, the opening 21 is formed in the program layer 20 provided above the metal interconnections B and C by, for example, laser beam irradiation, as shown in FIG. 2(a). When the data "1" is stored in the program layer 20, an opening is not formed in the program layer 20 to hold the same condition, as shown in FIG. 2(b).

Figure 3A:
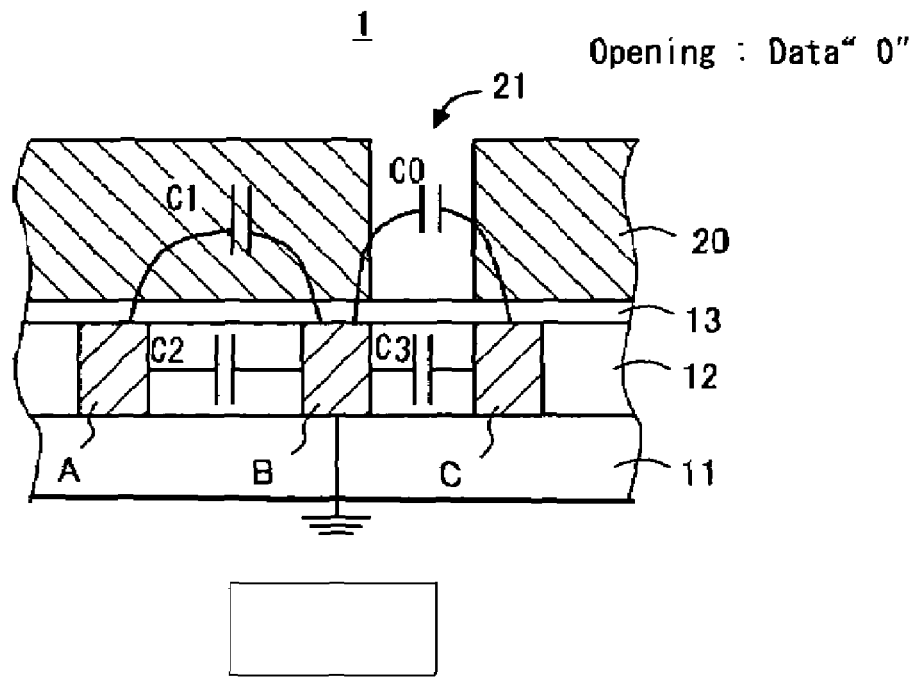
FIG. 3(a) and FIG. 3(b) show the states of the electrostatic capacitance for devices where an opening is formed in a program layer and where an opening is not formed in the program layer in accordance with an embodiment of the present invention.
Figure 3B:
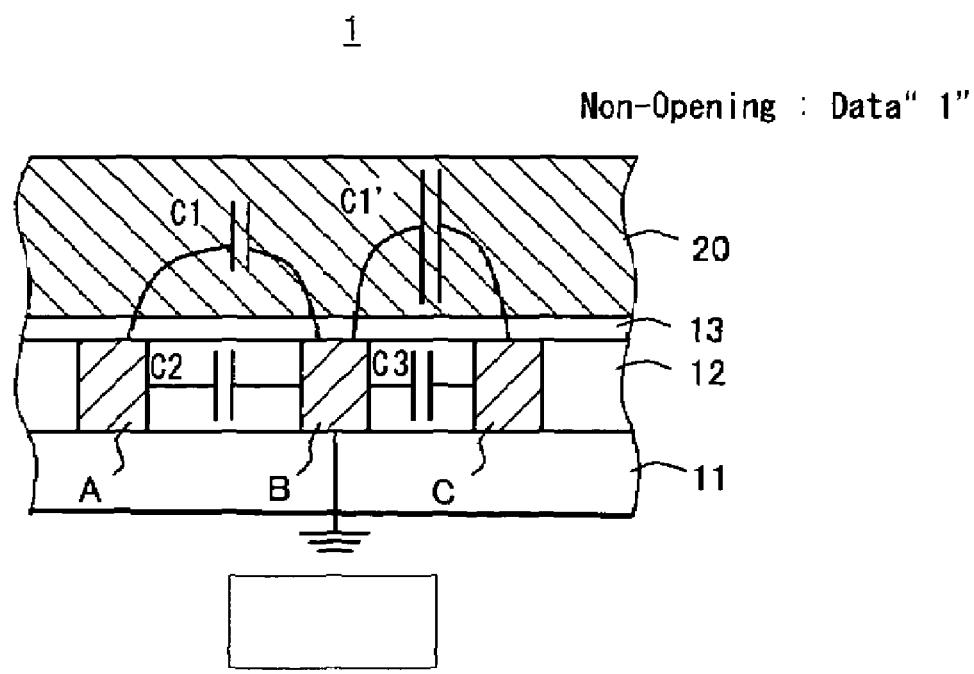

FIGS. 3(a) and 3(b) show the states of the electrostatic capacitance of cases where the opening 21 is formed in the program layer 20 and where the opening 21 is not formed in the program layer 20, respectively, in accordance with the embodiment of the present invention. FIG. 3(a) is a cross-sectional view of the logic device 1 in which the data "0" is stored in the program layer 20. FIG. 3(b) is a cross-sectional view of the logic device 1 in which the data "1" is stored in the program layer 20. The metal interconnection A and the metal interconnection C are provided at both sides of the metal interconnection B coupled to ground. A reference capacitor Cref (C1+C2) is formed between the metal interconnections A and B. A capacitor Cb (C0+C3 or C1'+C3), which has the electrostatic capacitance that varies depending on whether or not there is the opening 21, is formed between the metal interconnections B and C.

Hereinafter, a capacitor $Cb\_0$ denotes that the data "0" is stored and a capacitor $Cb\_1$ denotes that the data "1" is stored in the program layer 20 having or not having, respectively, the opening 21 formed therein. Equations [1] to [3] below are satisfied where the capacitor Cref is formed between the metal interconnections A and B and where the capacitor $Cb\_0$ has the data "0" and the capacitor $Cb\_1$ has the data "1" between the metal interconnections B and C.

$$Cref = C1 + C2 \quad [1]$$

$$Cb\_0 = C0 + C3 \quad [2]$$

$$Cb\_1 = C1' + C3 \quad [3]$$

The respective capacitors are configured to satisfy the relationship of $C0 < C1 < C1' < C2 < C3$. Also, an electrostatic capacitance C1 is configured to have twice as much as that of an electrostatic capacitance C0.

To detect the difference in the electrostatic capacitance between the data "0" and the data "1", the relationship $Cb\_0 < Cref < Cb\_1$ has to be satisfied. Therefore, the relationships $(C1-C0) > (C3-C2)$ and $(C3-C2) + (C1'-C1) > 0$ also have to be satisfied. Due to the use of the $SiO_2$ layer 12 for both capacitors C2 and C3, given the different thicknesses thereof, there is only a small difference in the electrostatic capacitance between the capacitors C2 and C3. Also, advantageously, multi-level data may be stored by changing the value of the electrostatic capacitance.

Figure 4:
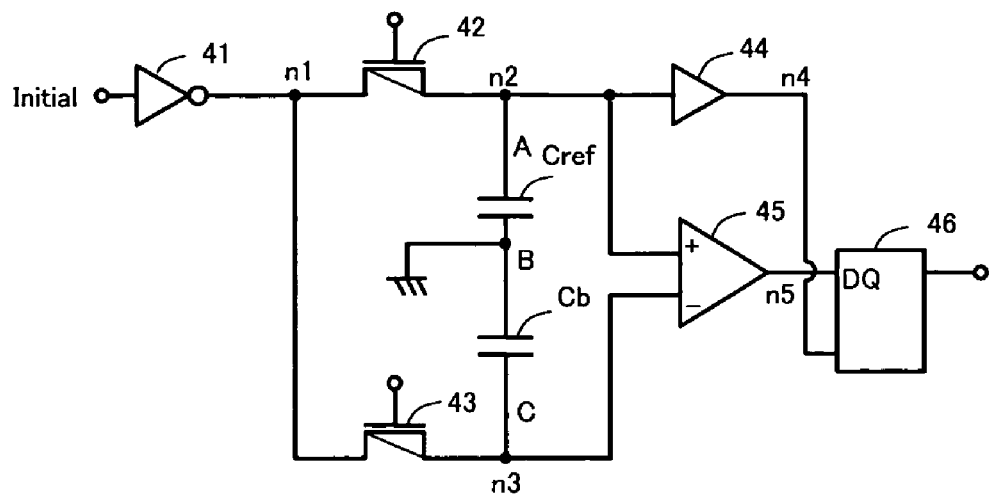
FIG. 4 shows a read circuit in accordance with an embodiment of the present invention.
Figure 5:
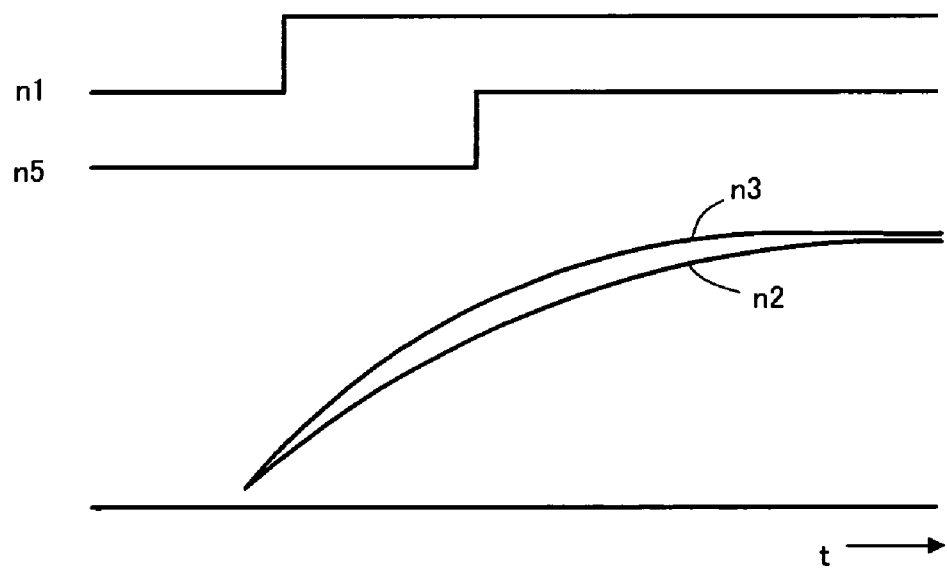
FIG. 5 shows signal waveforms of nodes in the read circuit in accordance with an embodiment of the present invention.

A read circuit that reads the information stored in the program layer 20 will hereinafter be described. FIG. 4 shows a read circuit 40 in accordance with the embodiment of the present invention. FIG. 5 shows signal waveforms of nodes in the read circuit 40. Referring to FIG. 4, the read circuit 40 includes an inverter 41, P-channel transistors 42 and 43, the capacitors Cref and Cb, a buffer 44, a comparator 45, and a D-type flip-flop 46. Optionally, the D-type flip-flop 46 may be replaced by a D-latch circuit. The read circuit 40 reads the programming information by detecting whether or not the opening 21 is formed in the program layer 20 through the use of the electrostatic capacitance of the capacitor between the pair of metal interconnections B and C (i.e., by measuring the capacitance between the pair of metal interconnections B and C). At this time, the read circuit 40 detects whether or not the opening 21 is formed in the program layer 20 with the use of the difference in the electrostatic capacity between the pair of metal interconnections B and C and that between the pair of reference metal interconnections A and B (i.e., by measuring the difference in the capacitance between the pair of metal interconnections B and C and the capacitance between the pair of reference metal interconnections A and B).

During a sense operation, first, an initial signal Initial is set to High and the voltages of the metal interconnection A and the metal interconnection B are set to ground. A signal that controls the gates of the P-channel transistors 42 and 43 is set to Low during reading. Then, when the initial signal Initial is set to Low, a node n1 is switched to High and a given voltage can be applied to the metal interconnections A and B and to the metal interconnections B and C below the program layer 20, via the P-channel transistors 42 and 43. Subsequently, nodes n2 and n3 are gradually charged. When the opening 21 is provided in the program layer 20 above the metal interconnections B and C, the electrostatic capacitance of the capacitor Cb is decreased and, thus, the capacitor Cb is charged faster than the capacitor Cref. The comparator 45 detects the difference and an output n5 is stored in the flip-flop circuit 46. In this manner, the opening 21 in the program layer 20 can be sensed as the data "0".

Alternatively, when the opening 21 is not provided in the program layer above the metal interconnections B and C, the electrostatic capacitance of the capacitor Cb is larger than that of the capacitor Cref. The capacitor Cref is therefore charged faster that the capacitor Cb and can be sensed as the data "1". In this manner, the data "1" or the data "0" can be sensed by detecting whether or not there is the opening 21 in the program layer 20, with the use of the electrostatic capacitance of the capacitor formed between the pair of the metal interconnections B and C and that of the capacitor formed between the pair of the reference metal interconnections A and B.

Figure 6:
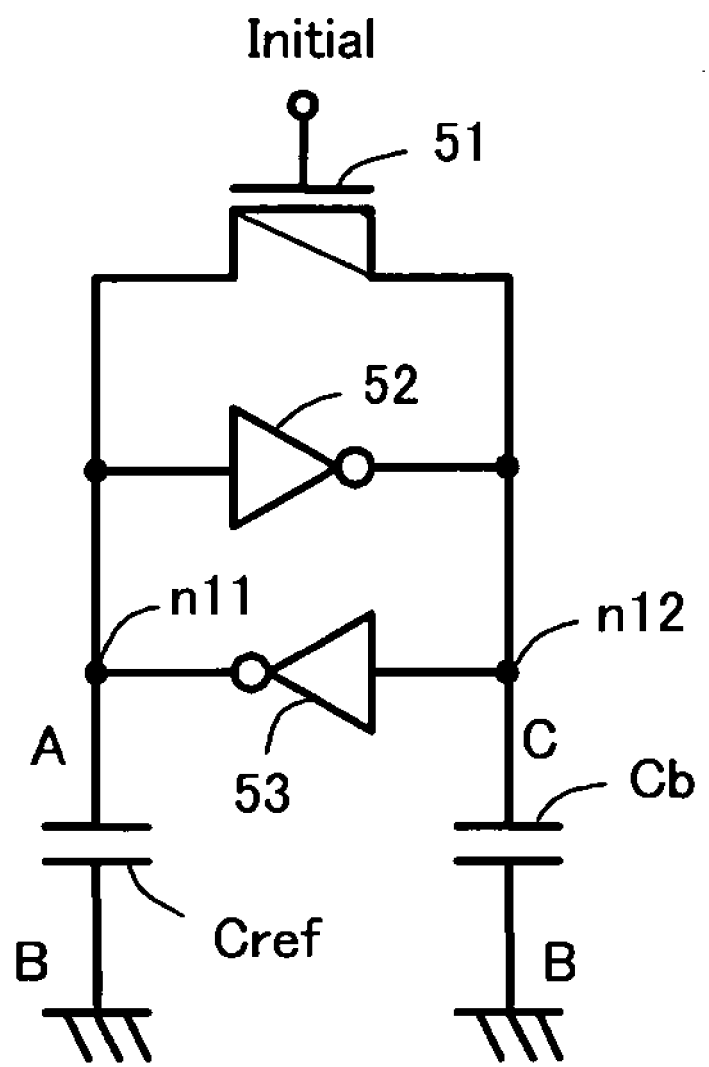
FIG. 6 shows another example of a configuration of the read circuit in accordance with an embodiment of the present invention.
Figure 7:
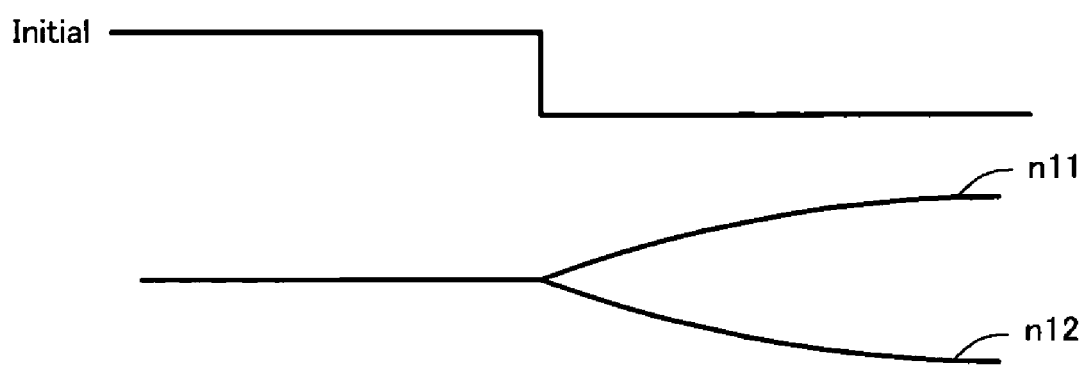
FIG. 7 shows the signal waveforms of the nodes in the read circuit of FIG. 6 in accordance with an embodiment of the present invention.

FIG. 6 shows another example of a configuration of a read circuit 50 in accordance with the embodiment of the present invention. FIG. 7 shows signal waveforms of nodes in the read circuit 50. Referring to FIG. 6, the read circuit 50 includes a P-channel transistor 51, inverters 52 and 53, and the capacitors Cref and Cb.

During a sense operation, the initial signal Initial is set to Low and the metal interconnection A and the metal interconnection C are set to have the same potential via the P-channel transistor 51. Nodes n11 and n12 are gradually charged. At this time, the potential is increased at the node having a smaller electrostatic capacitance out of the capacitors Cref and Cb, while the potential is decreased at the node having a greater electrostatic capacitance. Accordingly, when the opening 21 is formed in the program layer 20 above the metal interconnections B and C, the electrostatic capacity of the capacitor Cb is decreased (i.e., the potential of the node n12 is increased and that of the node n11 is decreased). In this manner, the data "0" can be sensed. Meanwhile, when the opening 21 is not provided in the program layer 20 above the metal interconnections B and C, the electrostatic capacitance of the capacitor Cb is greater than that of the capacitor Cref. The potential of the node n11 is increased and that of the node n12 is decreased. In this manner, the data "1" can be sensed. Such sensed data is latched by a latch circuit, not shown.

Figure 8:
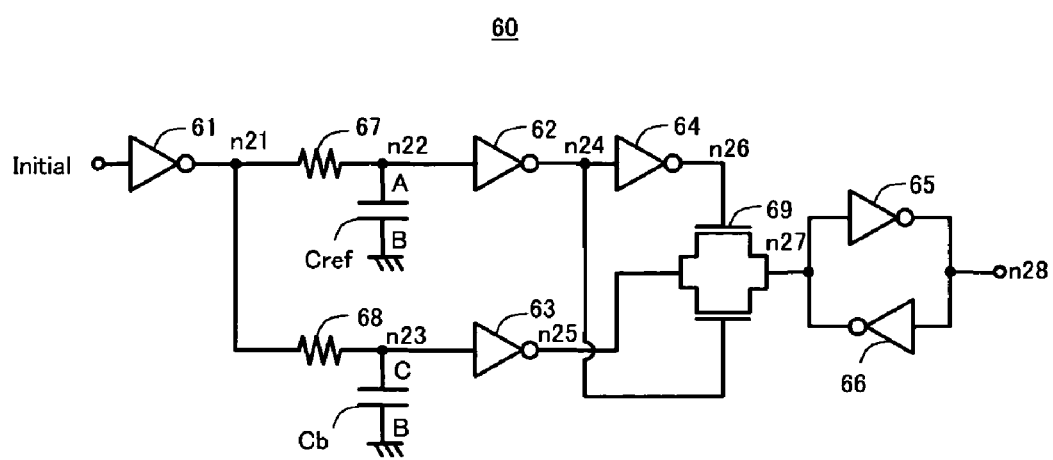
FIG. 8 shows yet another example of a configuration of the read circuit in accordance with an embodiment of the present invention.

FIG. 8 is yet another example of a configuration of a read circuit 60 in accordance with the embodiment of the present invention. FIGS. 9(a) to 9(f) show respective signal waveforms of the nodes in the read circuit 60. Referring to FIG. 8, the read circuit 60 includes inverters 61 through 66, resistors 67 and 68, a transfer gate 69, and the capacitors Cref and Cb. If a reference side exceeds a given potential (trip point), the read circuit 60 is triggered by the signal thereof to determine whether a compared side is high or low and operates to input such a determination to the latch circuit composed of the inverters 65 and 66.

During a sense operation, firstly, the initial signal Initial is set to High and the voltages of the metal interconnection A and the metal interconnection B are set to ground. When the initial signal is next switched to Low from High, thereby switching a node n21 to High, nodes n22 and n23 are respectively charged through the resistors 67 and 68. The potentials of the nodes n22 and 23 gradually increase. The node n22 serves as the reference side and the node n23 changes a charge-up speed in accordance with the capacitance of the capacitor Cb. The node n23 gradually charges up and, when the node n22 reaches a reference potential, a signal n24 changes. At this time, the data is latched in the latch circuit composed of the inverters 65 and 66.

Figure 9A:
FIG. 9(a) to FIG. 9(f) respectively show the signal waveforms of the nodes in the read circuit of FIG. 8 in accordance with an embodiment of the present invention.
Figure 9B:
Figure 9C:
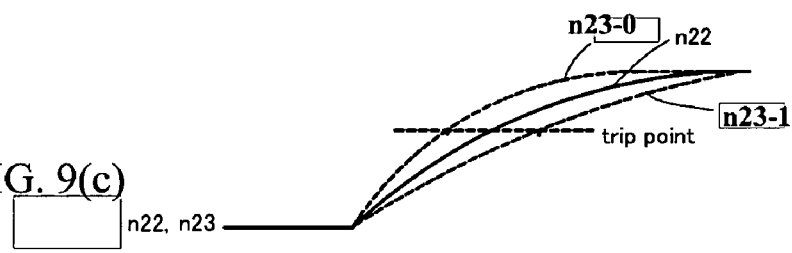
Figure 9D:
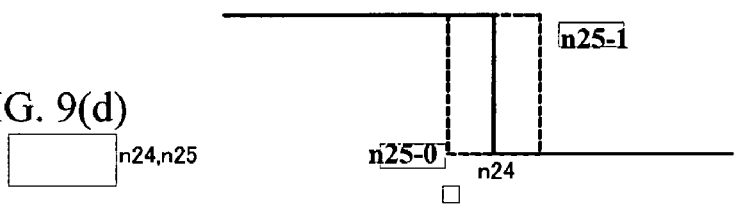
Figure 9E:
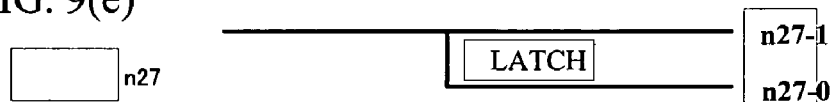
Figure 9F:

Referring to FIG. 9(c), a signal waveform n23–1 represents the signal waveform when the data "1" is programmed, and a signal waveform n23–0 represents the signal waveform when the data "0" is programmed. When the opening 21 is formed in the program layer 20 above the metal interconnections B and C, the electrostatic capacitance of the capacitor Cb is decreased and the capacitor Cb is charged faster than the capacitor Cref. As shown in FIG. 9(d), an output n25–1 from the inverter 63 drops before the reference potential n24 drops, thereby latching the data "0" in the latch circuit composed of the inverters 65 and 66. In contrast, when the opening 21 is not formed in the program layer 20 above the metal interconnections B and C, the capacitor Cref is charged faster than the capacitor Cb and the node n24 drops earlier than the node n25. Accordingly, a transfer gate n27 is closed and the latch circuit composed of the inverters 65 and 66 retains the data "1" state.

A description will next be given of another example of the program layer 20. In FIG. 2, there has been described an example of the program layer 20 composed of a material having a dielectric constant higher than that of air. Now, a description will be given of an example of the program layer 20 composed of a material having a dielectric constant lower than that of air or a material having a dielectric constant of zero. In a case where the dielectric constant is zero, a capacitance as much as almost infinite is available.

Figure 10A:
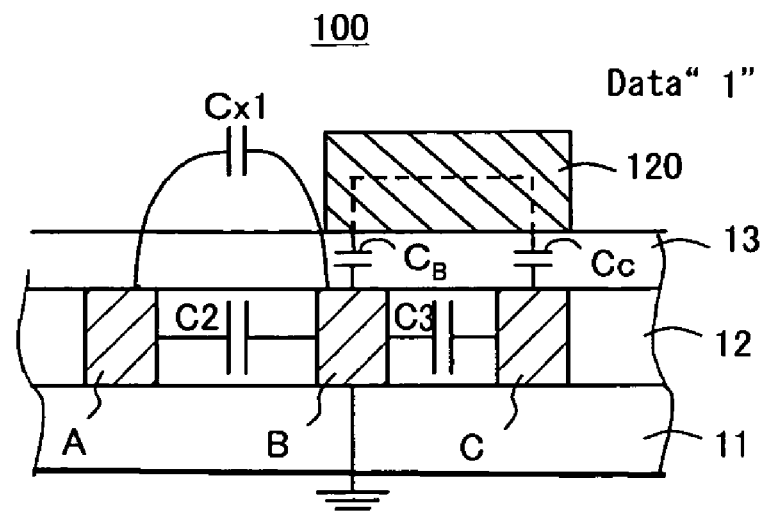
FIG. 10(a) is a cross-sectional view of the logic device in which the data "1" is stored in accordance with an embodiment of the present invention.
Figure 10A:
Figure 10B:
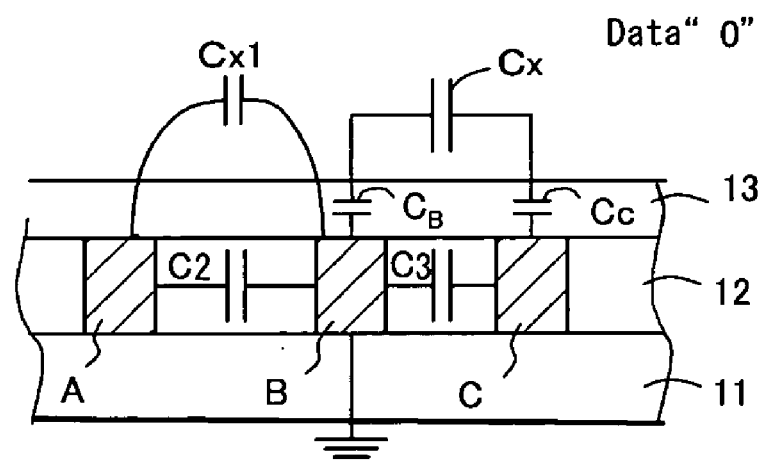
FIG. 10(b) is a cross-sectional view of the logic device in which the data "0" is stored in accordance with an embodiment of the present invention.
Figure 10B:

FIG. 10(a) is a cross-sectional view of a logic device 100 in accordance with an embodiment of the present invention in which the data "1" is stored. FIG. 10(b) is a cross-sectional view of a logic device 100 in accordance with the embodiment of the present invention in which the data "0" is stored. The metal interconnections A, B, and C are provided on the interlayer insulating film 11 formed above the semiconductor substrate 10 (FIG. 1). The metal interconnections are insulated one from another by the $SiO_2$ layer 12. The cover film 13 is provided on the metal interconnections A, B, and C. The cover film 13 is made of the $SiO_2$ film. Referring to FIG. 10(a), a program layer 120 is provided on the cover film 13. The program layer 120 is made of a metal which has a dielectric constant lower than that of air.

When the program layer 120 is provided on the cover film 13, the electrostatic capacitance of the capacitor Cb is produced with a parasitic capacitance $C_B$ between the metal interconnection B and the program layer 120 and a parasitic capacitance $C_C$ between the metal interconnection C and the program layer 120, which are connected in series through the metal of the program layer 120. Accordingly, a parasitic capacitance between the metal interconnection B and the metal interconnection C becomes greater. The data "1" can be sensed with the use of the read circuit shown in FIG. 4. In contrast, when there is nothing provided on the cover film 13, the electrostatic capacitance of the capacitor Cb is produced with the parasitic capacitance $C_B$ between the metal interconnection B and the program layer 120, the parasitic capacitance $C_C$ between the metal interconnection C and the program layer 120, and a parasitic capacitance $C_X$, which are all connected in series. This results in a reduced capacitance in total. The data "0" can then be sensed with the use of the read circuit shown in FIG. 4.

Figure 11:
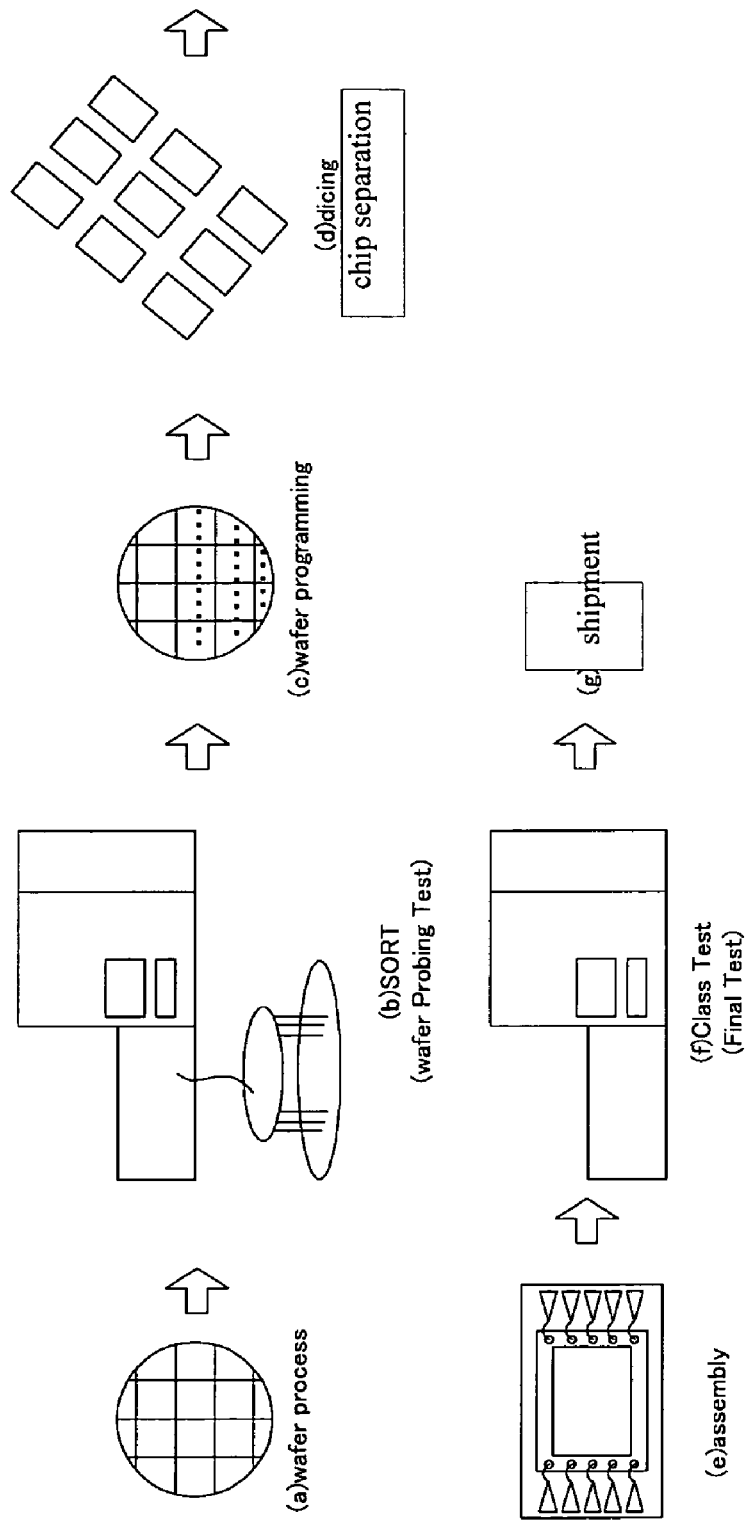
FIG. 11 shows a fabrication process of a semiconductor device in accordance with an embodiment of the present invention.

FIG. 11 shows a fabricating process of the semiconductor device in accordance with the embodiment of the present invention. The above-described program layer 20 is processed until the package is sealed after the cover film process is completed. First, integrated circuits (ICs) are fabricated on a wafer during the wafer process (a). During the wafer process, the metal interconnections are formed on the interlayer insulating film 11 provided above the semiconductor substrate. Then, a probe is applied onto the wafer to check the wafer characteristics during the wafer probing test process (b). Next, the program layer 20 or 120 is formed above the metal interconnections A through C, and/or the opening 21 is selectively formed in the program layer 20 by the laser beam in accordance with the programming information during the programming process of the wafer (c). The programming information includes the device ID, the trimming data, and/or data for fine adjustment in an analog IC. This enables the inclusion of a non-volatile memory region of several bits to approximately a hundreds bits without a memory cell transistor and enables the programming of different information for each semiconductor die.

The wafer on which a number of IC chips are fabricated is cut into dice with a diamond cutter along scribe lines provided on four sides of each chip to separate the wafer into individual chips during the dicing process (d). The individual chips are accommodated in a special package and the terminals and the package are bonded by wires during the assembly process (e). Subsequently, the final test (f) is carried out and shipment is made (g). In accordance with the semiconductor device of the present invention, an internally set value such as the information on the fine adjustment of the voltage in an analog circuit, or an individual ID or characteristic ID of a digital circuit is programmed after the wafer process and the wafer probing test are completed.

In accordance with the present invention, the program layer 20 or 120 is provided on the cover film 13 that covers the metal interconnections so that the information can be read by a circuit arranged below. This eliminates the necessity of an additional process during the wafer process resulting in cost reduction and improved throughput. In addition, the information can be programmed (c) after the wafer process (a) is completed shortening the period from programming (c) to shipment (g). Further, the program layer 20 or 120 is not in contact with the read circuit, making it possible to prevent moisture from coming into the semiconductor. Moreover, semiconductor devices in accordance with the embodiment of the present invention are possible to produce easier than semiconductor devices utilizing the conventional fuse and, in addition, the reliability of the device is not degraded. The above-described semiconductor device is also applicable to a semiconductor device that includes a memory cell array, in which memory cells are arranged in rows and columns.

Although a few preferred embodiments of the present invention have been shown and described, it would be appreciated by those skilled in the art that changes may be made in these embodiments without departing from the principles and spirit of the invention, the scope of which is defined in the claims and their equivalents. The non-volatile semiconductor memory device has been described in the above-mentioned embodiments as an example. However, the present invention is equally applicable to a semiconductor device having the non-volatile semiconductor memory device mounted thereon.

What is claimed is:

1. A semiconductor device comprising:
   a pair of metal interconnections provided above a semiconductor substrate;
   a programming material provided over the pair of metal interconnections, wherein an opening is selectively formed in the programming material in accordance with programming information; and
   a read circuit coupled to the pair of metal interconnections for reading the programming information by determining whether an opening has been formed in the programming material in response to an electrostatic capacitance between the pair of metal interconnections.

2. The semiconductor device as claimed in claim 1, further comprising a pair of reference metal interconnections formed below the programming material in the semiconductor device, wherein the read circuit is also coupled to the pair of reference metal interconnections and determines whether an opening is formed in the programming material based on the electrostatic capacitance that is present between the pair of metal interconnections and an electrostatic capacitance that is present between the pair of reference metal interconnections.

3. The semiconductor device as claimed in claim 2, wherein the pair of metal interconnections and the pair of reference metal interconnections include a shared metal interconnection portion.

4. The semiconductor device as claimed in claim 1, wherein the programming material comprises a material having a dielectric constant higher than that of air.

5. The semiconductor device as claimed in claim 1, wherein the programming material comprises either a conductor or a material having a dielectric constant lower than that of air.

6. The semiconductor device as claimed in claim 1, wherein said semiconductor device is a part of a memory cell of a memory cell array including non-volatile memory cells arranged in rows and columns.

* * * * *